US00RE49820E

(19) United States
(12) Reissued Patent
Zhao et al.

(10) Patent Number: US RE49,820 E
(45) Date of Reissued Patent: *Jan. 30, 2024

(54) SEMICONDUCTOR DEVICE HAVING A SELF-FORMING BARRIER LAYER AT VIA BOTTOM

(71) Applicant: GLOBALFOUNDRIES INC., Grand Cayman (KY)

(72) Inventors: Larry Zhao, Niskayuna, NY (US); Ming He, Albany, NY (US); Xunyuan Zhang, Albany, NY (US); Sean Xuan Lin, Watervliet, NY (US)

(73) Assignee: GlobalFoundries U.S. Inc., Santa Clara, CA (US)

( * ) Notice: This patent is subject to a terminal disclaimer.

(21) Appl. No.: 16/558,106

(22) Filed: Aug. 31, 2019

Related U.S. Patent Documents

Reissue of:
(64) Patent No.: 8,907,483
Issued: Dec. 9, 2014
Appl. No.: 13/648,433
Filed: Oct. 10, 2012

U.S. Applications:
(63) Continuation of application No. 15/335,313, filed on Oct. 26, 2016, now Pat. No. Re. 47,630, which is an application for the reissue of Pat. No. 8,907,483.

(51) Int. Cl.
*H01L 23/522* (2006.01)
*H01L 21/768* (2006.01)
*H01L 23/532* (2006.01)

(52) U.S. Cl.
CPC .... *H01L 23/5226* (2013.01); *H01L 21/76831* (2013.01); *H01L 21/76846* (2013.01); *H01L 21/76855* (2013.01); *H01L 23/53238* (2013.01); *H01L 23/53295* (2013.01); *H01L 2924/0002* (2013.01)

(58) Field of Classification Search
CPC ..... H01L 21/76855; H01L 21/76831; H01L 21/76846; H01L 2924/0002; H01L 2924/00; H01L 23/5226; H01L 23/53295; H01L 23/53238
See application file for complete search history.

(56) References Cited

U.S. PATENT DOCUMENTS 5,268,212 A 12/1993 Lumb et al.
5,371,041 A * 12/1994 Liou et al. ..... 438/653
5,374,041 A * 12/1994 Bernstein ..... 269/136
(Continued)

*Primary Examiner* — Krisanne M Jastrzab
*Assistant Examiner* — Jean C Witz
(74) *Attorney, Agent, or Firm* — Thompson Hine LLP; Francois Pagette

(57) ABSTRACT

An approach for forming a semiconductor device is provided. In general, the device is formed by providing a metal layer, a cap layer over the metal layer, and an ultra low k layer over the cap layer. A via is then formed through the ultra low k layer and the cap layer. Once the via is formed, a barrier layer (e.g., cobalt (Co), tantalum (Ta), cobalt-tungsten-phosphide (CoWP), or other metal capable of acting as a copper (CU) diffusion barrier) is selectively applied to a bottom surface of the via. A liner layer (e.g., manganese (MN) or aluminum (AL)) is then applied to a set of sidewalls of the via. The via may then be filled with a subsequent metal layer (with or without a seed layer), and the device may the then be further processed (e.g., annealed).

20 Claims, 4 Drawing Sheets

(56) References Cited

U.S. PATENT DOCUMENTS

| | | | | |
|---|---|---|---|---|
| 5,939,788 | A * | 8/1999 | McTeer | H01L 21/76877 257/751 |
| 6,403,415 | B1 | 6/2002 | Alers et al. | |
| 6,423,633 | B1 | 7/2002 | Tseng | |
| 6,528,884 | B1 * | 3/2003 | Lopatin et al. | 257/758 |
| 6,583,051 | B2 | 6/2003 | Lopatin | |
| 7,399,701 | B2 | 7/2008 | Ikeda | |
| 7,485,966 | B2 | 2/2009 | Jiang et al. | |
| 7,759,796 | B2 | 7/2010 | Hirota | |
| 8,207,595 | B2 | 6/2012 | Hsieh et al. | |
| 8,659,156 | B2 | 2/2014 | Yang et al. | |
| 2002/0008322 | A1 * | 1/2002 | Leiphart | 257/758 |
| 2006/0251872 | A1 * | 11/2006 | Wang | H01L 23/53238 428/209 |
| 2006/0267199 | A1 | 11/2006 | Ikeda | |
| 2007/0123043 | A1 * | 5/2007 | Streck | H01L 23/53238 438/687 |
| 2008/0142923 | A1 | 6/2008 | Tischler | |
| 2008/0207004 | A1 | 8/2008 | Sparks | |
| 2008/0280151 | A1 | 11/2008 | Jourdan et al. | |
| 2009/0014792 | A1 | 1/2009 | Reynes | |
| 2011/0204518 | A1 * | 8/2011 | Arunachalam | H01L 21/76843 257/751 |
| 2011/0227227 | A1 * | 9/2011 | West | H01L 21/76898 257/757 |

* cited by examiner

SEMICONDUCTOR DEVICE HAVING A SELF-FORMING BARRIER LAYER AT VIA BOTTOM

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is a continuation reissue of application Ser. No. 15/335,313, filed Oct. 26, 2016, which is an application for reissue of U.S. Pat. No. 8,907,483. More than one reissue application has been filed for the reissue of U.S. Pat. No. 8,907,483. The reissue applications are the present application and application Ser. No. 15/335,313, now U.S. Pat No. RE47,360.*

BACKGROUND

1. Technical Field

This invention relates generally to the field of semiconductors and, more particularly, to approaches for applying a self-forming barrier layer along bottom surfaces of vias, trenches, or the like.

2. Related Art

The semiconductor integrated circuit (IC) industry has experienced rapid growth in recent years. Specifically, generations of ICs have been produced whereby each generation has smaller and more complex circuits than the previous generation. However, for these advances to be realized, developments in IC processing and manufacturing are needed. Under this course of IC evolution, functional density (i.e., the number of interconnected devices per chip area) has generally increased while geometry size (i.e., the smallest component that can be created using a fabrication process) has decreased.

Semiconductor devices are typically formed using multiple layers of material, including conductive, semi-conductive, dielectric, and insulative layers. To provide electrical conductivity between layers in a semiconductor device, a hole or via may be formed through certain layers. The via is then lined with a barrier layer, such as Ti, TiN, or Ti/TiN, and filled with an electrically conductive material, such as a metal, to provide electrical conductivity between the layers.

Under previous approaches, multiple surfaces of a via were lined with the barrier layer, and the device was then subject to high temperatures. Unfortunately, barrier layers positioned along a bottom surface of the via often diffuse into the metal layer of the device positioned below the via. Such diffusion has adverse impacts on the reliability of the device.

SUMMARY OF THE INVENTION

An approach for forming a semiconductor device is provided. In general, the device is formed by providing a metal layer, a cap layer over the metal layer, and an ultra low k layer over the cap layer. A via is then formed through the ultra low k layer and the cap layer. Once the via is formed, a barrier layer (e.g., cobalt (Co), tantalum (Ta), cobalt-tungsten-phosphide (CoWP), or other metal capable of acting as a copper (CU) diffusion barrier is selectively applied to a bottom surface of the via. A liner layer (e.g., manganese (MN) or aluminum (AL)) is then applied to a set of sidewalls of the via. The via may then be filled with a subsequent metal layer (with or without a seed layer), and the device may then be further processed (e.g., annealed).

A first aspect of the present invention provides a method for forming a barrier layer in a semiconductor device, comprising: selectively applying the barrier layer along a bottom surface of a via of the semiconductor device; applying a liner layer along a set of sidewalls of the via; and annealing the semiconductor device.

A second aspect of the present invention provides a method for forming a barrier layer in a semiconductor device, comprising: selectively applying the barrier layer along a bottom surface of a via of the semiconductor device, the via being formed through an ultra low k layer and a cap layer of the semiconductor device; applying a liner layer over the barrier layer and along a set of sidewalls of the via; filling the via with a metal; and processing the semiconductor device to remove the liner layer from over the barrier layer.

A third aspect of the present invention provides a semiconductor device, comprising: a first metal layer; a cap formed over the first metal layer; an ultra low k layer formed over the cap layer; and a via formed through the ultra low k layer and the cap layer, the via comprising a barrier layer selectively formed along a bottom surface of the via, and a liner layer along a set of sidewall of the via.

BRIEF DESCRIPTION OF THE DRAWINGS

These and other features of this invention will be more readily understood from the following detailed description of the various aspects of the invention taken in conjunction with the accompanying drawings in which.

Figure 1A:
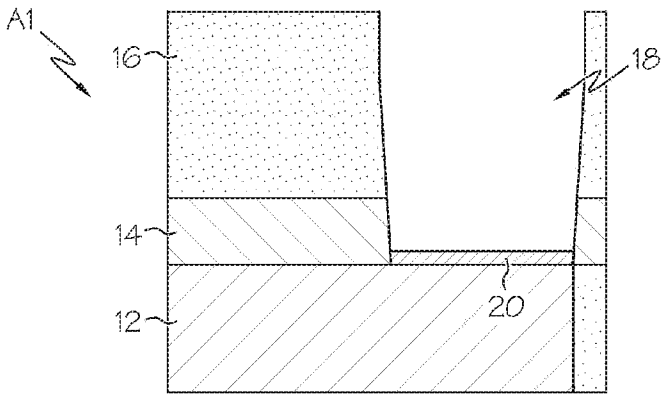
FIGS. 1A-D shows a cross-section view of a semiconductor device during its formation according to an embodiment of the present invention.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION OF THE INVENTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As indicated above, an approach for forming a semiconductor device is provided. In general, the device is formed by providing a metal layer, a cap layer over the metal layer, and an ultra low k layer over the cap layer. A via is then formed through the ultra low k layer and the cap layer. Once the via is formed, a barrier layer (e.g., cobalt (Co), tantalum (Ta), cobalt-tungsten-phosphide (CoWP), titanium (Ti), tantalum nitride (TaN), ruthenium (Ru), or other metal capable of acting as a copper (CU) diffusion barrier is selectively applied to a bottom surface of the via. A liner layer (e.g., manganese (MN) or aluminum (AL)) is then applied to a set of sidewalls of the via. The via may then be filled with a subsequent metal layer (with or without a seed layer), and the device may the then be further processed (e.g., annealed).

Figure 1B:
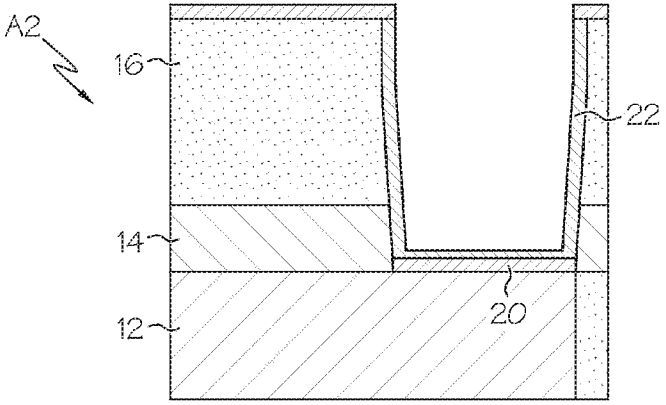
Figure 1C:
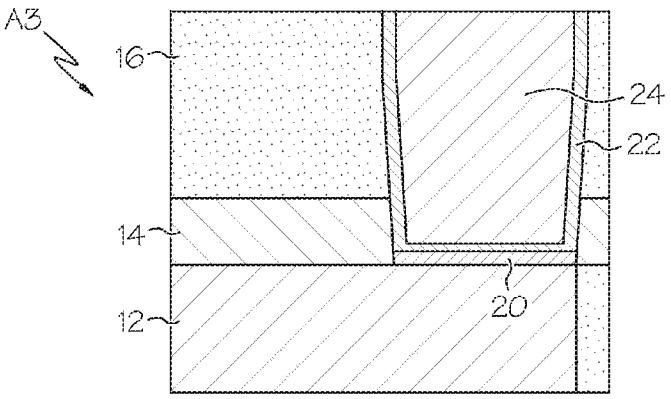
Figure 1D:
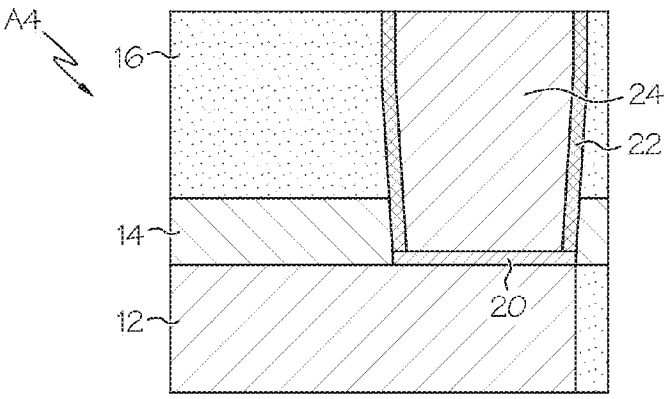

Referring now to FIGS. 1A-D a progression (A1-A4) for forming a semiconductor device 10 according to an embodiment of the present invention is shown. As depicted in step A1, a metal layer 12 (e.g., copper) is provided, over which a cap layer 14 and an ultra low k layer 16 (e.g., dielectric) are formed. A via 18 is then formed though ultra low k layer 16 and cap layer 14. A barrier layer 20 is then selectively applied to the bottom surface of via 18 as shown. As depicted, barrier layer 20 is only positioned along the bottom surface of via 18 (not along the side walls of via 18). In this embodiment, barrier layer 20 is typically cobalt (Co), but may also be tantalum (Ta), cobalt-tungsten-phosphide (CoWP), titanium (Ti), tantalum nitride (TaN), ruthenium (Ru), or other metal capable of acting as a copper (CU) diffusion barrier. Moreover, as shown in FIG. 1, barrier layer 20 may be applied via selective chemical vapor deposition (CVD).

In any event, once barrier layer 20 has been applied, a liner layer 22 may be applied to the sidewalls of via (and optionally over barrier layer 20 and/or an upper surface of ultra low k layer 16) in step A2. The liner layer 22 may be manganese (Mn), aluminum (Al) or the like. After the liner layer 22 has been applied, via 18 will be filled with a metal layer 24 (e.g., Cu) in step A3. Optionally, a seed layer may be applied prior to applying metal layer 24. Regardless, in step A4, further processing may be applied to device 10 such as annealing or thermal budging, which converts liner layer 22 to $MNSi_xO_y$ while leaving barrier layer 20 intact.

Figure 2A:
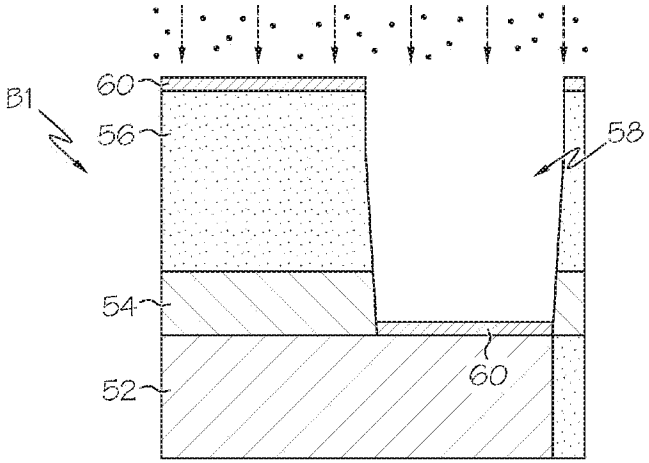
FIGS. 2A-D shows a cross-section view of a semiconductor device during its formation according to an embodiment of the present invention.
Figure 2B:
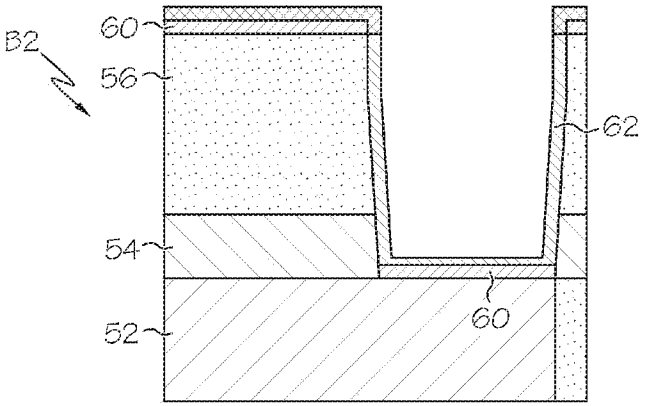
Figure 2C:
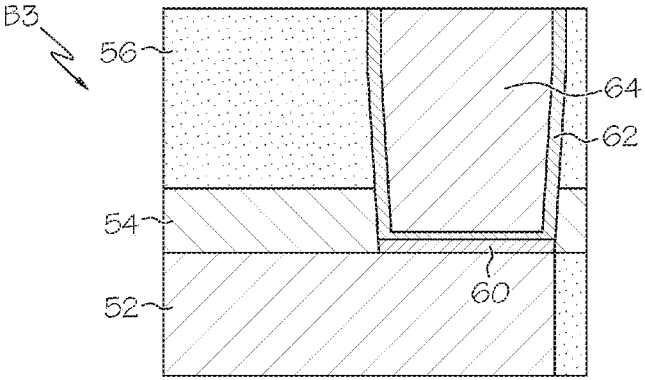
Figure 2D:
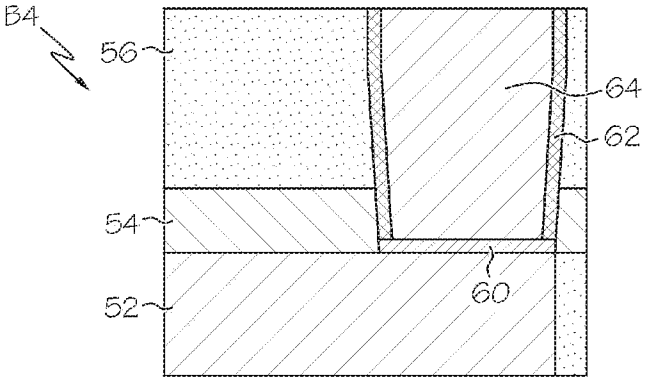

Referring to FIGS. 2A-D, a progression (B1-B4) for forming a semiconductor device 50 is shown. Device 50 will be formed in a similar fashion to device 10 of FIG. 1. As depicted in step B5, a metal layer 52 (e.g., copper) is provided, over which a cap layer 54 and an ultra low k layer 56 (e.g., dielectric) are formed. A via 58 is then formed though ultra low k layer 56 and cap layer 54. A barrier layer 60 is then selectively applied to the bottom surface of via 58 as shown (and along upper surface of ultra low k layer 56). As depicted, barrier layer 60 is only positioned along the bottom surface (not along the side walls of via 58) and is provided/applied via collimated pressurized vapor deposition (PVD). In this embodiment, barrier layer 60 is typically tantalum (Ta), but may also be cobalt (Co), cobalt-tungsten-phosphide (CoWP), titanium (Ti), tantalum nitride (TaN), ruthenium (Ru), or other metal capable of acting as a copper (CU) diffusion barrier.

In any event, once barrier layer 60 has been applied, a liner layer 62 may be applied to the sidewalls of via (and optionally over barrier layer 60) in step B2. The liner layer 62 may be manganese (Mn), aluminum (Al) or the like. After the liner layer 62 has been applied, via 58 will be filled with a metal layer 64 (e.g., Cu) in step B3. Optionally, a seed layer may be applied prior to applying metal layer 64. Regardless, in step B4 further processing may be applied to device 50 such as annealing or thermal budging, which converts liner layer 62 to $MNSi_xO_y$ while leaving barrier layer 60 intact.

Figure 3A:
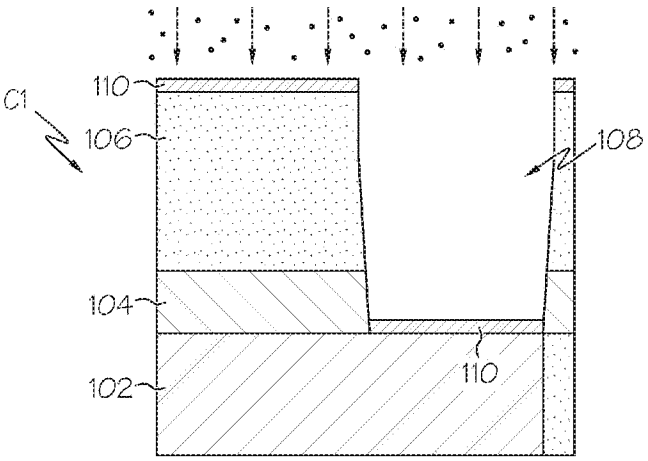
FIGS. 3A-D shows another cross-section view of a semiconductor device during its formation according to an embodiment of the present invention.
Figure 3B:
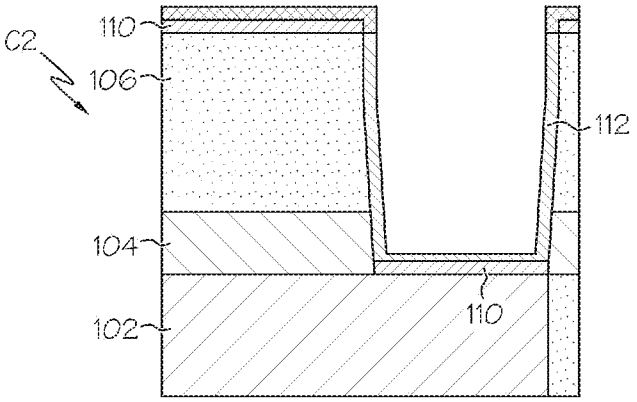
Figure 3C:
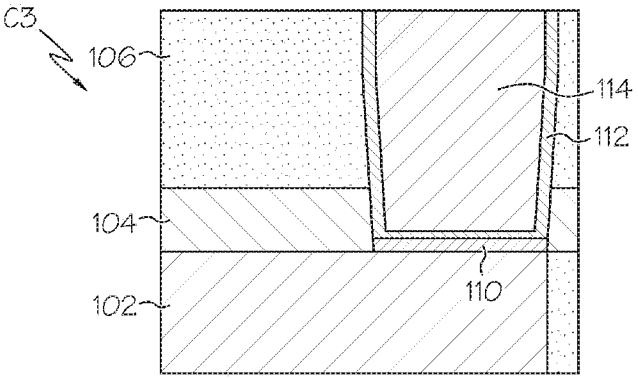
Figure 3D:
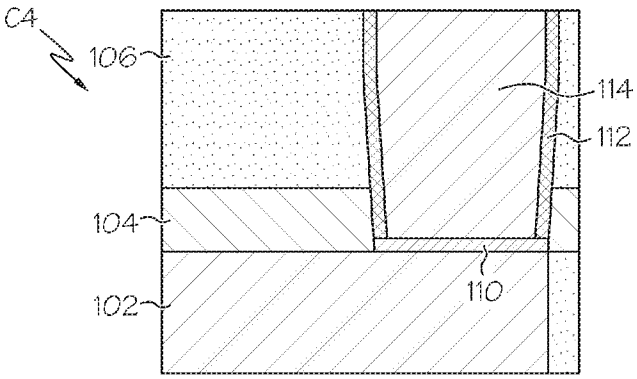

Referring to FIGS. 3A-D, a progression (C1-C4) for forming a semiconductor device 100 is shown. Device 100 will be formed in a similar fashion to device 10 of FIG. 1. As depicted in step C1, a metal layer 102 (e.g., copper) is provided, over which a cap layer 104 and an ultra low k layer 106 (e.g., dielectric) are formed. A via 108 is then formed though ultra low k layer 106 and cap layer 104. A barrier layer 110 is then selectively applied to the bottom surface of via 108 as shown. As depicted, barrier layer 110 is only positioned along the bottom surface of via 108 (not along the side walls of via 108), and along an upper surface of ultra low k layer 106. Moreover, barrier layer provided/applied via gas cluster ion beam (GSIB) infusion. In this embodiment, barrier layer 110 is typically Ta, but may be may be cobalt (Co), cobalt-tungsten-phosphide (CoWP), titanium (Ti), tantalum nitride (TaN), ruthenium (Ru), or other metal capable of acting as a copper (CU) diffusion barrier.

In any event, once barrier layer 110 has been applied, a liner layer 112 may be applied to the sidewalls of via (and optionally over barrier layer 110) in step C2. The liner layer 112 may be manganese (Mn), aluminum (Al) or the like. After the liner layer 112 has been applied, via 108 will be filled with a metal layer 114 (e.g., Cu) in step C3. Optionally, a seed layer may be applied prior to applying metal layer 114. Regardless, in step C4 further processing may be applied to device 100 such as annealing or thermal budging, which converts liner layer 112 to $MNSi_xO_y$ while leaving barrier layer 110 intact.

Figure 4B:
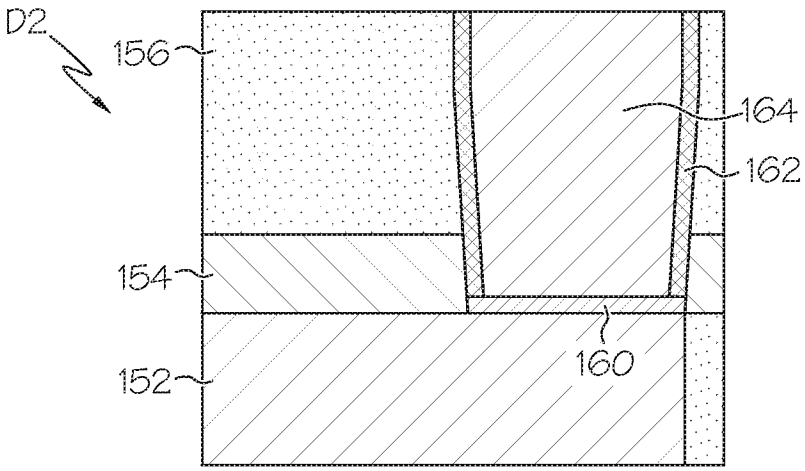
FIGS. 4A-B shows another cross-section view of a semiconductor device during its formation according to an embodiment of the present invention.
Figure 4A:
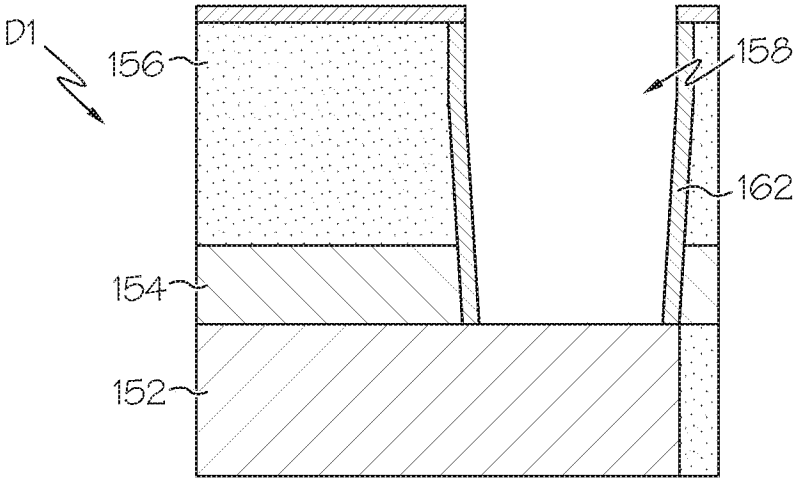

Referring to FIGS. 4A-D, steps D1-D2 demonstrate that barrier layer 160 and liner layer 162 may be applied in any order (e.g., barrier layer 160 need not be applied to a vial 58's bottom surface prior to applying liner layer 162 to side walls of via 158). Specifically, as shown, device 150 is formed by providing a metal layer 152 (e.g., copper), over which a cap layer 154 and an ultra low k layer 156 (e.g., dielectric) are formed. A via 158 is then formed though ultra low k layer 106 and cap layer 104. As shown, liner layer 160 (e.g., manganese (Mn), aluminum (Al), etc.) is applied to side walls (and a top surface of ultra low k layer 156) in step D1. In step D2, barrier layer 160 may then be applied using any of the materials and/or techniques discussed above in conjunction with FIGS. 1-3. Although not shown in separate steps, it is understood that to complete device 150, a metal layer 164 will be provided via 158 (e.g., with or without a seed layer), and device 150 will be subjected to additional processing (e.g., annealing, etc.).

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

[1. A method for forming a barrier layer in a semiconductor device, comprising:

selectively applying the barrier layer along a bottom surface of a via of the semiconductor device, the barrier layer formed along a metal layer of the semiconductor device;

applying a liner layer along a set of sidewalls of the via; and annealing the semiconductor device.]

[2. The method of claim 1, the barrier layer comprising a metal capable of copper (Cu) diffusion.]

[3. The method of claim 1, the liner layer further being applied over the barrier layer and the liner layer comprising a metal.]

[4. The method of claim 1, the barrier layer being applied via a process selected from a group consisting of: chemical vapor deposition (CVD), physical vapor deposition (PVD), gas cluster ion beam (GCIB) infusion, and electroless deposition (ELD).]

[5. The method of claim 1, further comprising applying a seed layer over the barrier layer.]

[6. The method of claim 1, the via being formed through an ultra low k (ULK) layer and a cap layer of the semiconductor device, the ultra low k layer being formed over the cap layer.]

[7. A method for forming a barrier layer in a semiconductor device, comprising:

selectively applying the barrier layer along a bottom surface of a via of the semiconductor device, the via being formed through an ultra low k layer and a cap layer of the semiconductor device;

applying a liner layer over the barrier layer and along a set of sidewalls of the via;

filling the via with a metal; and processing the semiconductor device to remove the liner layer from over the barrier layer.]

[8. The method of claim 7, the barrier layer comprising a metal capable of copper (Cu) diffusion.]

[9. The method of claim 1, the liner layer further being applied over the barrier layer and the liner layer comprising a metal.]

[10. The method of claim 7, the barrier layer being applied via a process selected from a group consisting of: chemical vapor deposition (CVD), physical vapor deposition (PVD), gas cluster ion beam (GCIB) infusion, and electroless deposition (ELD).]

[11. The method of claim 7, further comprising applying a seed layer over the barrier layer.]

[12. The method of claim 7, the via being formed through an ultra low k (ULK) layer and a cap layer of the semiconductor device, the ultra low k layer being formed over the cap layer.]

[13. The method of claim 12, the barrier layer forming a barrier between the via and a metal layer of the semiconductor device, the cap layer being formed over the metal layer.]

[14. A semiconductor device, comprising:

a first metal layer;

a cap formed over the first metal layer;

an ultra low k layer formed over the cap layer; and a via formed through the ultra low k layer and the cap layer, the via comprising a barrier layer selectively formed along a bottom surface of the via, and a liner layer along a set of sidewall of the via.]

[15. The semiconductor surface of claim 14, further comprising a second metal layer formed inside of the via.]

[16. The semiconductor surface of claim 14, the liner layer comprising a metal selected from a group consisting of manganese (Mn) and aluminum (Al).]

[17. The semiconductor surface of claim 14, the second metal layer comprising copper (Cu).]

[18. The semiconductor surface of claim 14, the barrier layer comprising a metal selected from the group consisting of: cobalt (Co), tantalum (Ta), and copper-tungsten phosphide (CoWP).]

[19. The semiconductor surface of claim 14, further comprising a seed layer applied in the via over the liner layer and the barrier layer.]

*20. A method of forming a semiconductor device, the method comprising:*

*forming a dielectric layer over a first metal layer;*

*forming a via extending through the dielectric layer;*

*applying a barrier layer only along a bottom surface of the via on the first metal layer;*

*applying a liner layer along a plurality of sidewalls of the via; and*

*filling the via with a second metal layer.*

*21. The method of claim 20, wherein the barrier layer comprises ruthenium (Ru).*

*22. The method of claim 20, wherein the liner layer is further applied over the barrier layer, and the liner layer comprises a metal.*

*23. The method of claim 21, wherein the barrier layer is applied via a process selected from the group consisting of: chemical vapor deposition (CVD), physical vapor deposition (PVD), gas cluster ion beam (GCIB) infusion, and electroless deposition (ELD).*

*24. The method of claim 20, further comprising:*

*applying a seed layer over the barrier layer.*

*25. The method of claim 20, wherein the via is formed through a cap layer, and the dielectric layer is formed over the cap layer.*

*26. The method of claim 20, wherein the second metal layer comprises copper (Cu).*

*27. A method of forming a semiconductor device, the method comprising:*

*forming a cap layer and a dielectric layer over a metal layer;*

*forming a via extending through the cap layer and the dielectric layer;*

*selectively applying a barrier layer only along a bottom surface of the via on the metal layer;*

*applying a liner layer over the barrier layer and along a plurality of sidewalls of the via; and*

*filling the via with copper (Cu).*

*28. The method of claim 27, wherein the barrier layer comprises a metal capable of acting as a copper (Cu) diffusion barrier.*

*29. The method of claim 27, wherein the barrier layer comprises ruthenium (Ru).*

*30. The method of claim 27, wherein the barrier layer is applied via a process selected from the group consisting of: chemical vapor deposition (CVD), physical vapor deposition (PVD), gas cluster ion beam (GCIB) infusion, and electroless deposition (ELD).*

*31. The method of claim 27, further comprising:*

*applying a seed layer over the barrier layer.*

*32. The method of claim 27, wherein the dielectric layer is formed over the cap layer.*

*33. The method of claim 32, wherein the barrier layer forms a barrier between the via and the metal layer.*

*34. A semiconductor device comprising:*

*a first metal layer;*

*a cap layer over the first metal layer;*

*a dielectric layer over the cap layer;*

*a via extending through the dielectric layer and the cap layer to the first metal layer;*

*a barrier layer on only the first metal layer along a bottom surface of the via; and*

*a liner layer along a plurality of sidewalls of the via and over a top surface of the barrier layer.*

*35. The semiconductor device of claim 34, further comprising:*

*a second metal layer inside the via.*

*36. The semiconductor device of claim 34, wherein the liner layer comprises manganese (Mn) or aluminum (Al).*

*37. The semiconductor device of claim 35, wherein the second metal layer comprises copper (Cu).*

*38. The semiconductor device of claim 34, wherein the barrier layer comprises ruthenium (Ru).*

*39. The semiconductor device of claim 34, further comprising:*

*a seed layer in the via over the liner layer and the barrier layer.*

* * * * *